(12) United States Patent
Nobori et al.

(10) Patent No.: US 6,864,574 B1
(45) Date of Patent: Mar. 8, 2005

(54) SEMICONDUCTOR PACKAGE

(75) Inventors: Kazuhiro Nobori, Osaka-fu (JP); Yosinori Sakai, Osaka-fu (JP); Kazuo Arisue, Osaka-fu (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 0 days.

(21) Appl. No.: 09/722,737

(22) Filed: Nov. 28, 2000

(30) Foreign Application Priority Data

Nov. 29, 1999   (JP) ............................................. 11-337785

(51) Int. Cl.⁷ .......................... H01L 23/34; H01L 23/10
(52) U.S. Cl. ..................... 257/720; 257/706; 257/707
(58) Field of Search ................................ 257/720, 706, 257/707, 712, 737, 738

(56) References Cited

U.S. PATENT DOCUMENTS

| | | | |
|---|---|---|---|
| 4,514,587 A | | 4/1985 | Van Dyk Soerewyn |
| 4,849,803 A | | 7/1989 | Yamamoto et al. |
| 5,294,750 A | * | 3/1994 | Sakai et al. ................. 174/52.4 |
| 5,448,114 A | * | 9/1995 | Kondoh et al. ............. 257/778 |
| 5,559,374 A | | 9/1996 | Ohta et al. |
| 5,783,466 A | * | 7/1998 | Takahashi et al. .......... 438/122 |
| 5,886,408 A | | 3/1999 | Ohki et al. |
| 6,046,495 A | * | 4/2000 | Urushima .................... 257/668 |
| 6,133,637 A | * | 10/2000 | Hikita et al. ................. 257/777 |
| 6,201,696 B1 | * | 3/2001 | Shimizu et al. ............. 361/704 |
| 6,337,228 B1 | * | 1/2002 | Juskey et al. ............... 438/122 |

OTHER PUBLICATIONS

Von Reinhold Bayerer et al., "Leistungshalbleitermodule in Direky–Bonding–Technik", Technische Rundschau, vol. 80, No. 32, Aug. 5, 1988, pp. 38–41, 43 and 45.

Bruce M. Romenesko, "Ball Grid Array and Flip Chip Technologies: Their Histories and Prospects", The International Journal of Microcircuits and Electronic Packaging, vol. 19, No. 1, 1996, pp. 64–74.

* cited by examiner

Primary Examiner—Amir Zarabian
Assistant Examiner—Kiesha Rose
(74) Attorney, Agent, or Firm—Wenderoth, Lind & Ponack, L.L.P.

(57) ABSTRACT

Electrodes of one face of a semiconductor, which has electrodes formed on both faces, and a heat radiating plate are directly joined to quickly absorb and diffuse heat of the semiconductor, thereby improving a heat radiation effect. At the same time, electrodes on an opposite face of the semiconductor are connected to pillared electrodes that are thicker than a wire for wire bonding and larger in current capacity. These pillared electrodes can accordingly be utilized as connecting terminals to a circuit board. Ceramic is used for the heat radiating plate, so that semiconductors of different functions can be mounted simultaneously.

18 Claims, 8 Drawing Sheets

SEMICONDUCTOR PACKAGE

BACKGROUND OF THE INVENTION

The present invention relates to a package for a semiconductor used in electronic equipment and a method for forming the semiconductor package.

A semiconductor is an essential component in forming circuits of electronic equipment and, various forms for mounting semiconductors have been developed and practiced lately. A form of a package as shown in FIG. 12 has been employed to facilitate handling and mounting semiconductors in the prior art.

An example of the aforementioned prior art will be described with reference to the drawing.

FIG. 12 shows a sectional view of a form of a conventional semiconductor package.

A semiconductor 1 has an upper first electrode 2 (upper a electrode) and an upper second electrode 3 (upper b electrode) set to one face, and a lower electrode 5 set to an opposite end face in its entirety. A circuit board 7 has predetermined circuit patterns formed on both faces which are joined by a through hole conductor (not shown), thereby forming a single circuit by the two faces. In some cases, balls 8 essentially consisting of gold, silver, copper, or solder are joined, as connecting bodies for connecting the circuit board 7 to another electric circuit, or to a circuit pattern of another circuit board to facilitate connection of the circuit board 7 to the another electric circuit.

The semiconductor package is formed by joining the semiconductor 1 and the circuit board 7 to one another. First, the lower electrode 5 is joined by solder 6 to the circuit pattern of the circuit board 7. A conductive paste or gold may be used in place of the solder 6 for joining the lower electrode 5 to the circuit pattern.

Meanwhile, the upper first electrode 2 (upper a electrode) and the upper second electrode 3 (upper b electrode) are generally connected to the circuit pattern by wire bonding with use of a gold wire or aluminum wire 4.

In order to protect a circuit forming part primarily consisting of the semiconductor 1, the circuit board 7 at the face to which the semiconductor 1 is mounted is coated with use of an insulating resin 9 in a manner not to deform the joining gold wire or aluminum wire 4. The semiconductor package is formed in this manner with a protection effect and ease of use improved.

The insulating resin 9 is supplied by molding with use of a mold, pouring molten resin, heating and melting resin in the form of powder or particles after placing the resin on an upper face of the semiconductor 1, or by a similar manner, thereby coating the semiconductor entirely.

When the semiconductor is heated to a great extent in the above-described constitution, the circuit board is not sufficient to radiate heat. Even if the circuit board is formed of ceramic exhibiting good heat conductivity, and used to radiate heat to a heat radiating plate or the like, emphasis is put on forming the circuit pattern; that is, heat radiation is not taken into considerable consideration, whereby a radiation lose is easily generated. Also, even if the gold wire or aluminum wire is utilized to radiate heat, since the gold wire or aluminum wire used for wire bonding is limited in diameter, the wire should be used within a current capacity allowed for its diameter. A plurality of joints must be carried out for one electrode to cope with a large current as in a power source circuit. Although a distance between electrodes must be secured to ensure safety and reliability in accordance with a current increase, the distance is hard to secure in the case where the gold wire or aluminum wire is used because the wire is varied in shape at the time of wire bonding, deformed during subsequent processes, or the like.

SUMMARY OF THE INVENTION

An object of the present invention is accordingly to resolve the above issues and provide a semiconductor package which is comprised of one or a plurality of semiconductors and can exhibit a superior heat radiation effect, with the semiconductor package being of a simple structure and a stable quality. A method for forming the semiconductor package is also an object of the invention.

In order to accomplish the above objectives, the present invention is constituted as will be described below.

In accomplishing these and other aspects, according to a first aspect of the present invention, there is provided a semiconductor package comprising:

a first semiconductor having electrodes formed on both of an upper and a lower face;

a heat radiating plate to which a lower face electrode of the first semiconductor is joined with use of a joining member; and pillared (columnar) or spherical electrodes which are joined to upper face electrodes of the first semiconductor and the heat radiating plate, respectively.

According to a second aspect of the present invention, there is provided a semiconductor package according to the fist aspect, further comprising a scaling resin with which the first semiconductor and a face of the heat radiating plate joined to the first semiconductor are covered in a manner to expose a part of leading ends of the pillared or spherical electrodes.

According to a third aspect of the present invention, there is provided a semiconductor package according to the first or second aspect, further comprising a second semiconductor having electrodes formed on both of an upper and a lower face, and being of the same kind as the first semiconductor. A lower face electrode of the second semiconductor is joined to the heat radiating plate with use of a joining member. The heat radiating plate has an electric circuit of an equal polarity formed of a single one of or a combination of gold, silver, copper, nickel, and tungsten and set to ceramic, with the first and second semiconductors being joined to the electric circuit of equal polarity.

According to a fourth aspect of the present invention, there is provided a semiconductor package according to the first or second aspect, further comprising a third semiconductor having electrodes formed on both of an upper and a lower face, and being of a different kind relative to the first semiconductor. A lower face electrode of the third semiconductor is joined to the heat radiating plate with use of a joining member. The heat radiating plate has an electric circuit of a plurality of independent polarities with the circuit being formed of a single one of or a combination of gold, silver, copper, nickel, and tungsten and set to ceramic, with the first and third semiconductors of different kinds being joined respectively to the plurality of polarities of the electric circuit.

According to a fifth aspect of the present invention, there is provided a semiconductor package according to any one of the first through fourth aspects, wherein the heat radiating plate is constituted of ceramic multilayer structure, having a circuit for the semiconductor and the pillared or spherical electrodes. The circuit is formed of a single one of or a combination of gold, silver, copper, nickel, and tungsten and set to a front face of the heat radiating plate. The heat radiating plate has conductive layers formed of a material equal to a material of the electrodes on the front face of the heat radiating plate, and arranged between layers of ceramic to be connected to the circuit on the front face of the heat radiating plate, so that heat of the semiconductor is radiated by both the ceramic and the conductive layers.

According to a sixth aspect of the present invention, there is provided a semiconductor package according to the first or second aspect, wherein the heat radiating plate is formed of any one of copper, a copper alloy, aluminum, and an aluminum alloy, or any one of these metals subjected to surface treatment.

According to a seventh aspect of the present invention, there is provided a semiconductor package according to any one of the first through sixth aspects, wherein exposed leading ends of the pillared or spherical electrodes are formed by simultaneously removing part of a sealing resin and part of the pillared or spherical electrodes after the pillared or spherical electrodes are covered with the sealing resin, thereby exposing the pillared or spherical electrodes to constitute electric connecting parts.

According to an eighth aspect of the present invention, there is provided a semiconductor package according to any one of the first through seventh aspects, wherein the pillared or spherical electrodes have leading ends pressed smoothly to a uniform height.

According to a ninth aspect of the present invention, there is provided a semiconductor package according to any one of the first through eighth aspects, wherein the pillared or spherical electrodes are formed to have materials of different hardnesses constituting an inside thereof and an outside thereof, respectively.

According to a tenth aspect of the present invention, there is provided a semiconductor package according to any one of the first through eighth aspects, wherein the pillared or spherical electrodes are formed to have materials of different melting temperatures constituting an inside thereof and an outside thereof, respectively.

According to an eleventh aspect of the present invention, there is provided a semiconductor package according to any one of the first through third aspects, further comprising a fourth semiconductor having electrodes formed on both of an upper and a lower face and being of a different kind relative to the first semiconductor. The fourth semiconductor has a lower face electrode of equal current and voltage characteristics relative to those of the first semiconductor. The lower face electrode of the fourth semiconductor is joined to the heat radiating plate with use of a joining member, such that the fourth semiconductor is mounted on the heat radiating plate along with the first semiconductor.

According to a twelvth aspect of the present invention, there is provided a semiconductor package according to any one of the first through eleventh aspects, wherein the heat radiating plate is provided with pits and projections on a face opposite to a face joined to the semiconductors.

According to a thirteenth aspect of the present invention, there is provided a semiconductor package according to any one of the first through twelvth aspects, wherein a plurality of bumps are disposed between the upper face electrodes of the semiconductors and the pillared or spherical electrodes.

According to a fourteenth aspect of the present invention, there is provided a method for forming a semiconductor package, comprising:

joining a lower face electrode of a first semiconductor, which has electrodes formed on both of an upper and a lower face, to a heat radiating plate with use of a joining member, and joining pillared (columnar) or spherical electrodes to the upper face electrodes of the first semiconductor and the heat radiating plate, respectively.

According to a fifteenth aspect of the present invention, there is provided a method for forming a semiconductor package according to the fourteenth aspect, further comprising, after the pillared or spherical electrodes are respectively joined to the upper face electrodes of the first semiconductor and the heat radiating plate, covering the first semiconductor and a face of the heat radiating plate joined to the first semiconductor with a sealing resin in a manner to expose a part of leading ends of the pillared or spherical electrodes.

According to a sixteenth aspect of the present invention, there is provided a method for forming a package according to the fourteenth or fifteenth aspect, wherein when the first semiconductor is joined to the heat radiating plate, a lower face electrode of a second semiconductor, of the same kind as the first semiconductor and having electrodes formed on both of an upper and a lower face thereof, is joined to the heat radiating plate with use of a joining member. The first and second semiconductors are joined to an electric circuit having a polarity equal to that of the heating radiating plate, with the electric circuit of equal polarity being formed of a single one of or a combination of gold, silver, copper, nickel, and tungsten, and set to ceramic.

According to a seventeenth aspect of the present invention, there is provided a method for forming a semiconductor package according to the fourteenth or fifteenth aspect, wherein when the first semiconductor is joined to the heat radiating plate, a lower face electrode of a third semiconductor, of a different kind relative to the first semiconductor and having electrodes formed on both of an upper and a lower face thereof, is joined to the heat radiating plate with use of a joining member. The first and third semiconductors are joined to an electric circuit of a plurality of independent polarities on the heat radiating plate, with the electric circuit being formed of a single one of or a combination of gold, silver, copper, nickel, and tungsten and set to ceramic.

According to an eighteenth aspect of the present invention, there is provided a method for forming a semiconductor package according to any one of the fourteenth through seventeenth aspects, further comprising before the semiconductor is joined to the heat radiating plate: forming on a front face of the heat radiating plate constituted of a ceramic multilayer structure, a circuit for the semiconductors and the pillared or spherical electrodes from a single one of or a combination of gold, silver, copper, nickel, and tungsten; and arranging conductive layers of a material equal to a material of the electrodes on the front face of the heat radiating plate, between layers of the ceramic. The conductive layers are to be connected to the circuit on the front face of the heat radiating plate, so that heat of the semiconductors is radiated by both the ceramic layers and the conductive layers.

According to a nineteenth aspect of the present invention, there is provided a method for forming a semiconductor package according to the fourteenth or sixteenth aspect, wherein the heat radiating plate is formed from any one of copper, a copper alloy, aluminum, and an aluminum alloy, or any one of these metals subjected to surface treatment before the semiconductor is joined to the heat radiating plate.

According to a twentieth aspect of the present invention, there is provided a method for forming a semiconductor package according to any one of the fourteenth through nineteenth aspects, further comprising:

after the pillared or spherical electrodes are respectively joined to the upper face electrodes of the first semiconductor and the heat radiating plate, covering the pillared or spherical electrodes with a sealing resin; and thereafter removing part of the sealing resin and part of the pillared or spherical electrodes simultaneously, thereby exposing the pillared or spherical electrodes to constitute electric connecting parts.

According to a twenty first aspect of the present invention, there is provided a method for forming a semiconductor package according to any one of the fourteenth through twentieth aspects, further comprising, after the pillared or spherical electrodes are respectively joined to the upper face electrodes of the first semiconductor and the heat radiating plate, smoothly pressing leading ends of the pillared or spherical electrodes to a uniform height.

According to a twenty second aspect of the present invention, there is provided a method for forming a semiconductor package according to any one of the fourteenth through twenty first aspects, wherein when the pillared or spherical electrodes are respectively joined to the upper face electrodes of the first semiconductor and the heat radiating plate, the pillared or spherical electrodes are of materials of different hardnesses which constitute an inside and an outside of the pillared or spherical electrodes, respectively.

According to a twenty third aspect of the present invention, there is provided a method for forming a semiconductor package according to any one of the fourteenth through twenty first aspects, wherein when the pillared or spherical electrodes are respectively joined to the upper face electrodes of the first semiconductor and the heat radiating plate, the pillared or spherical electrodes are of materials of different melting temperatures which constitute an inside and an outside of the pillared or spherical electrodes, respectively.

According to a twenty fourth aspect of the present invention, there is provided a method for forming a semiconductor package according to any one of the fourteenth through sixteenth aspects, wherein when the first semiconductor is joined to the heat radiating plate, a lower face electrode of a fourth semiconductor, having electrodes formed on both of an upper and a lower face thereof and being of a different kind relative to the first semiconductor, with the lower face electrode having current and voltage characteristics equal to that of the first semiconductor, is joined to the heat radiating plate with use of a joining member, so that the first and fourth semiconductors are mounted on the heat radiating plate.

According to a twenty fifth aspect of the present invention, there is provided a method for forming a semiconductor package according to any one of the fourteenth through twenty fourth aspects, further comprising providing the heat radiating plate with pits and projections at a face opposite to the face joined to the semiconductors.

According to a twenty sixth aspect of the present invention, there is provided a method for forming a semiconductor package according to any one of the fourteenth through twenty fifth aspects, further comprising forming a plurality of bumps on the upper face electrodes of the semiconductors, wherein when the pillared or spherical electrodes are joined to the upper face electrodes of the semiconductors, the pillared or spherical electrodes are joined to the upper face electrodes of the semiconductors via the plurality of bumps.

BRIEF DESCRIPTION OF THE DRAWINGS

These and other aspects and features of the present invention will become clear from the following description taken in conjunction with the preferred embodiments thereof with reference to the accompanying drawings. In which.

DETAILED DESCRIPTION OF THE PREFERRED EMBODIMENTS

Figure 1:
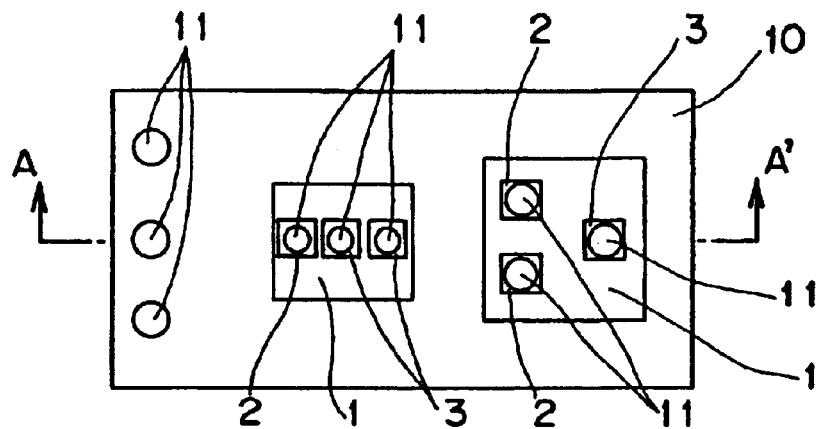
FIG. 1 is a plan view of a semiconductor package according to a first embodiment of the present invention.

Before the description of the present invention proceeds, it is to be noted that like parts are designated by like reference numerals throughout the accompanying drawings.

Semiconductor packages and methods for forming the semiconductor packages according to embodiments of the present invention will be discussed in detail below on the basis of drawings.

(FIRST EMBODIMENT)

Figure 2:
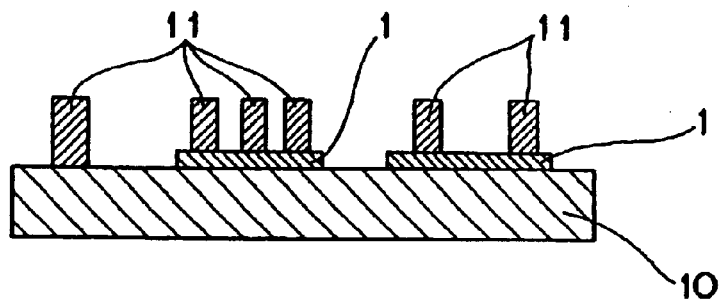
FIG. 2 is a sectional view of the semiconductor package of the first embodiment of the present invention taken along a line A—A of FIG. 1.

FIG. 1 is a plan view of a semiconductor package according to a first embodiment of the present invention, and FIG. 2 is a sectional view of the semiconductor package.

Figure 19:
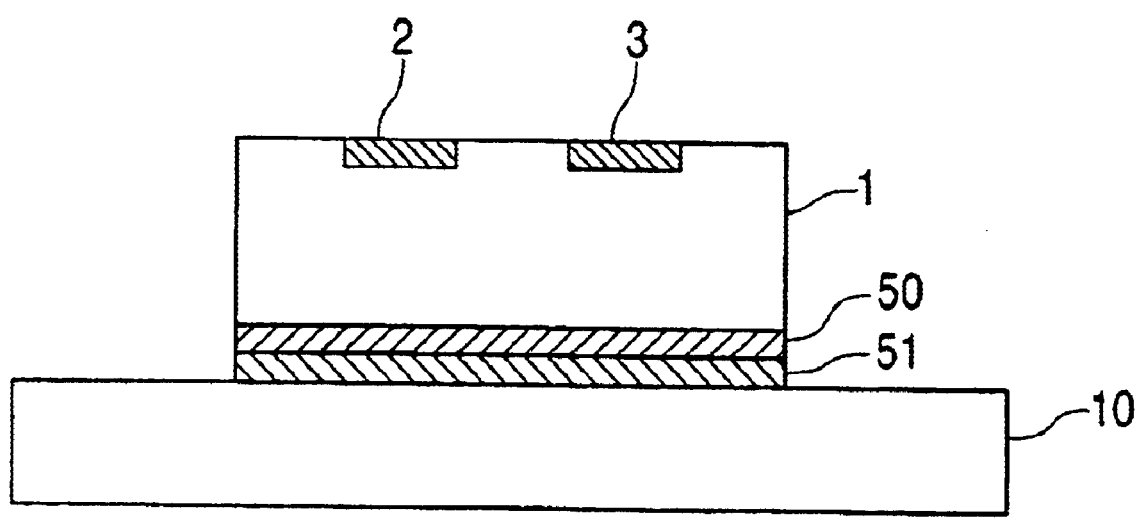
FIG. 19 is a schematic cross-sectional view showing connection of a lower face electrode to a heat radiating plate via solder or conductive paste.

In the semiconductor package according to the first embodiment of the present invention, as schematically shown in FIG. 19, a lower face electrode 50 of a semiconductor 1, having electrodes formed on both upper and lower faces, is joined to a heat radiating plate 10 with use of solder 51. Upper face electrodes 2 and 3 of the semiconductor 1, and the radiating plate 10, are joined to pillared (columnar) or spherical electrodes 11.

The heat radiating plate 10 is formed of any one of copper, a copper alloy, aluminum, and an aluminum alloy. The metallic radiating plate 10 and the lower face electrode of the semiconductor 1 are joined to each other by solder. A thickness of a layer of the solder is made as small as possible, so that its heat conduction efficiency is improved. Other example of a joining member are conductive paste, gold, or the like. When the joining member is solder, heat conductance, joining properties (case of joining) of the semiconductor, and heat resistance may be improved. When the embodiment is applied to drivers of industrial motors such as AC servo motors, and there is caused any lock of rotation of the motor to generate heat of about 120° C. to which the, joining member is subjected, such a joining member is preferably formed of solder. When the joining member is of gold, heat conduction properties become high and electrical resistance becomes lower.

The pillared or spherical electrodes 11 formed of a metal essentially consisting of any one of gold, silver, copper, and aluminum are joined to the upper face electrode 2 (upper a electrode) and the upper face electrode 3 (upper 17 electrode) of the semiconductor 1, and are also joined to the metallic radiating plate 10 with use of ultrasonic oscillation, solder, or conductive pasta. The conductive paste, is a mixture of a metallic powder such as gold, silver, or the like and generally an epoxy resin or silicone resin having thermosetting properties and insulating properties, thereby exhibiting electrically conductive and adhesive properties.

Leading end parts of the pillared or spherical electrodes 11 at a side not to be joined to the semiconductor 1 and the metallic radiating plate 10 are used for being joined to a circuit board after the semiconductor package is completed. For this purpose, it is necessary to form the pillared or spherical electrodes 11 without a step, in other words at an approximately equal height.

Mixed-mounting of semiconductor 1 of different kinds can be carried out on the metallic radiating plate 10 if the semiconductors have equal current and voltage characteristics relative to the lower face electrode.

In the above constitution, the lower face electrode of the semiconductor 1 is joined to the radiating plate 10 with use of the solder, while the upper face electrodes 2 and 3 of the semiconductor 1, and the radiating plate 10, are joined to the pillared or spherical electrodes 11. When a radiating plate 10 of metal is used, the semiconductor 1 is always joined directly only via the solder to the metallic radiating plate 10, so that heat of the semiconductor 1 is considerably quickly transmitted to the metallic radiating plate 10, spread throughout the entirety of the radiating plate 10 and radiated from a surface of the radiating plate 10. A temperature rise of the semiconductor 1 is accordingly prevented. Moreover, the metallic radiating plate 10 is utilizable as a conductor for the lower face electrode if a connecting terminal is joined to the radiating plate 10.

(SECOND EMBODIMENT)

Figure 3:
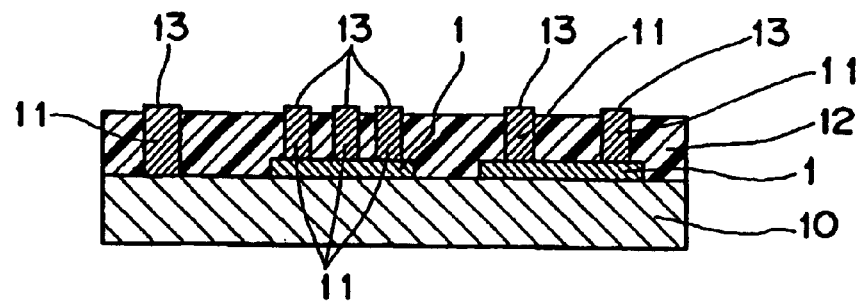
FIG. 3 is a sectional view of a semiconductor package according to a second embodiment of the present invention.

FIG. 3 is a sectional view of a semiconductor package according to a second embodiment of the present invention which uses a sealing resin 12 having insulating properties.

The semiconductor package in the second embodiment of the present invention is formed by covering the semiconductor package of the first embodiment with the sealing resin 12 in a manner to partly expose the pillared or spherical electrodes 11.

More specifically, after joining the pillared or spherical electrodes 11 of the first embodiment, the semiconductor 1 is covered with the sealing resin 12 by use of a mold or jig so that end parts of the pillared or spherical electrodes 11 at a side to be joined to a circuit board project from the sealing resin 12, e.g., by approximately 50–200 $\mu$m, thereby forming projecting parts 13.

When the mold is to be used, the semiconductor package of the first embodiment is arranged beforehand within a cavity of the mold. Molten sealing resin 12 is injected into the cavity generally by injection molding, then cooled and hardened. When the jig is to be used, on the other hand, the metallic radiating plate 10 is peripherally surrounded by a material not to be joined to the sealing resin 12, and then molten sealing resin 12 is poured between the metallic radiating plate and the material, cooled and hardened. Alternatively, a specified amount of powder or particle sealing resin 12 is provided along the periphery of the radiating plate 10, heated, melted, cooled and hardened.

In the above-described arrangement, after the lower face electrode of the semiconductor 1 is joined to the radiating plate 10 with use of the solder and, the upper face electrodes 2 and 3 of the semiconductor 1, and the radiating plate 10, are joined to the pillared or spherical electrodes 11, the semiconductor 1 is covered with the sealing resin 12 to expose the projecting parts 13 as part of the pillared or spherical electrodes 11. Since the semiconductor 1 is covered with the sealing resin 12, except for the projecting or leading parts 13 of the pillared or spherical electrodes 11, each component is protected from deformation, damage, moisture, dust, or the like and the semiconductor package after completion becomes easy to handle.

(THIRD EMBODIMENT)

Figure 4:
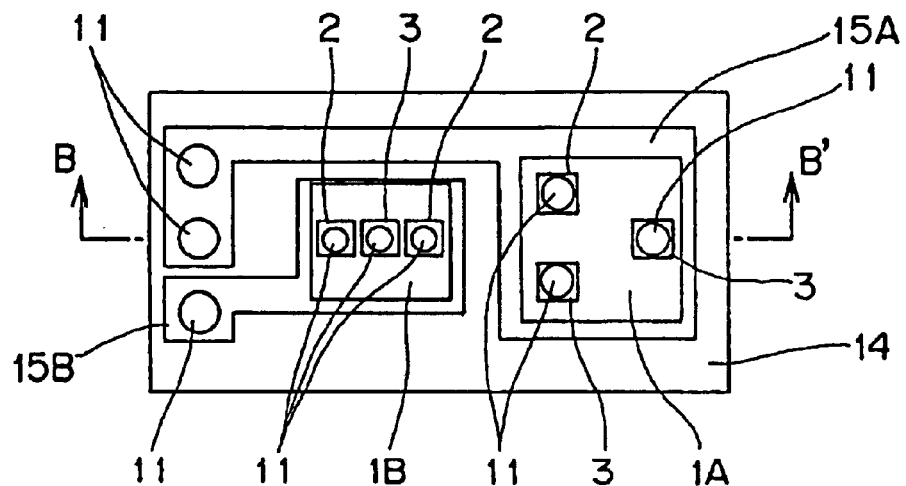
FIG. 4 is a plan view of a semiconductor package according to a third embodiment of the present invention.
Figure 5:
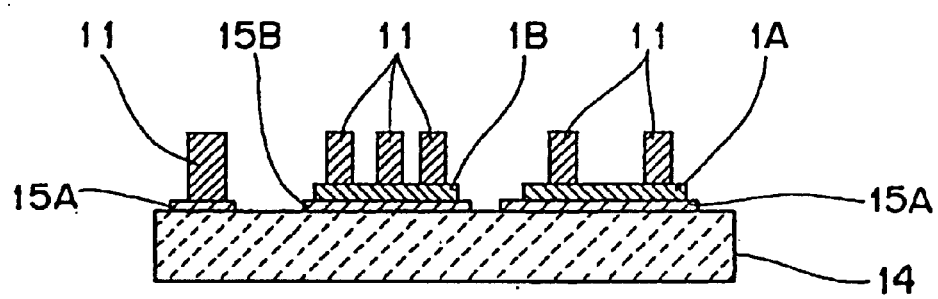
FIG. 5 is a sectional view of the semiconductor package of the third embodiment of the present invention taken along a line B—B of FIG. 4.

FIGS. 4 and 5 are a plan view and a sectional view of a semiconductor package according to a third embodiment of the present invention which uses a ceramic radiating plate 14 having insulating properties.

In FIGS. 4 and 5, an electric circuit (15A, 15B) for joining a lower electrode of the semiconductor (1A, 1B) is formed on an upper face of the ceramic radiating plate 14 with use of gold, silver, copper, nickel, tungsten, or the like.

Figure 13:
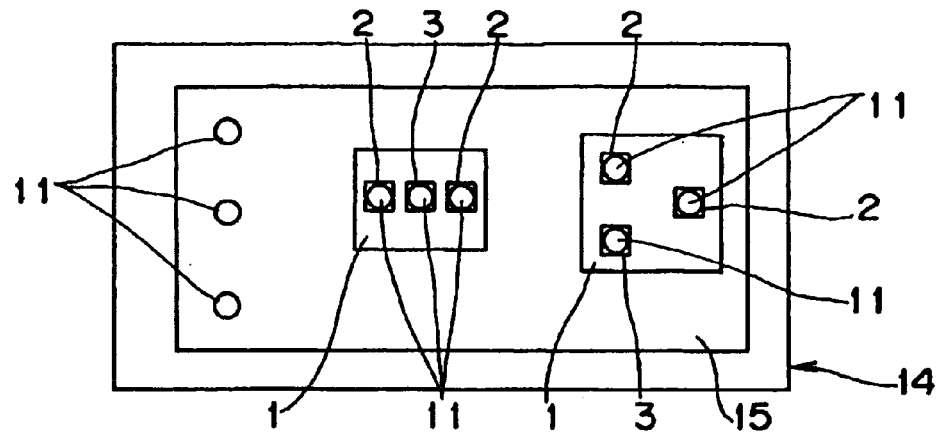
FIG. 13 is a plan view of the semiconductor package of the third embodiment of the present invention when electric circuits of equal polarities are formed on the entire surface of a ceramic radiating plate.

In the case where only one semiconductor is to be mounted, where a plurality of semiconductors of the same kind are to be mounted, or where a plurality of semiconductors 1A, 1B of different kinds with equal current and voltage characteristics at a side of the lower face electrodes are to be mounted, an electrode circuit 15 of an equal polarity is formed of the aforementioned material on the entire surface of the ceramic radiating plate 14 as shown in FIG. 13.

On the other hand, in the case where a plurality of semiconductors 1A and 1B of different kinds and different current and voltage characteristics at a side of the lower face electrodes are to be mounted, electric circuits 15A and 15B of a plurality of different polarities are formed independently of each other for the lower face electrodes of respective semiconductors 1A and 1B, on which are to be set the pillared or spherical electrodes 11, as shown in FIG. 4.

Any of the semiconductors 1, 1A, and 1B is mounted by soldering onto the electric circuit 15, 15A, 15B, respectively. Thereafter, the pillared or spherical electrodes 11 are joined to respective ones of the semiconductors and the electric circuits 15, 15A, 15B with use of any one of ultrasonic oscillation, solder, and conductive paste.

In forming the electric circuit 15 of a conductive paste, a resin component in the conductive paste is preferably burnt by baking at 600–1600° C. to effectuate an intermetallic bond, so that heat conduction efficiency is improved through firm joining of the circuit 15 with the ceramic radiating plate 14.

Generally, when current and voltage characteristics are different between lower face electrodes of semiconductors 1A and 1B of different kinds to be mounted on the same radiating plate 14, the mounting is impossible if the radiating plate is metallic. However, in an arrangement where the electric circuit 15 of the same polarity, or electric circuits 15A and 15B of a plurality of polarities are formed of a single one of or a combination of gold, silver, copper, nickel, or tungsten on the entire face or part of the face of the ceramic radiating plate 14, while the radiating plate 14 and the semiconductors 1, or, 1A and 1B are joined the radiating plate 14 and the pillared or spherical electrodes 11 are also joined. Since the plurality of polarities are provided independently of each other on the radiating plate 14 with utilization of insulating, heat conductive, and radiation properties of the ceramic radiating plate 14, the semiconductors can be independent and mounted on an equal face. At the same time, when a semiconductor is covered with the sealing resin 12 in the application of the earlier second embodiment, since the radiating plate 14 itself is an insulator, electrically active parts except the leading end parts 13 of the pillared or spherical electrodes 11 to be connected to a circuit board are prevented from being exposed, thereby improving safety and reliability. Moreover, a thin wiring is eliminated and an allowable current can be made large when the electric circuit 15 of an equal polarity is formed. An area of a metallic wiring conducting heat well is increased, whereby heat radiation properties can be improved.

(FOURTH EMBODIMENT)

Figure 6:
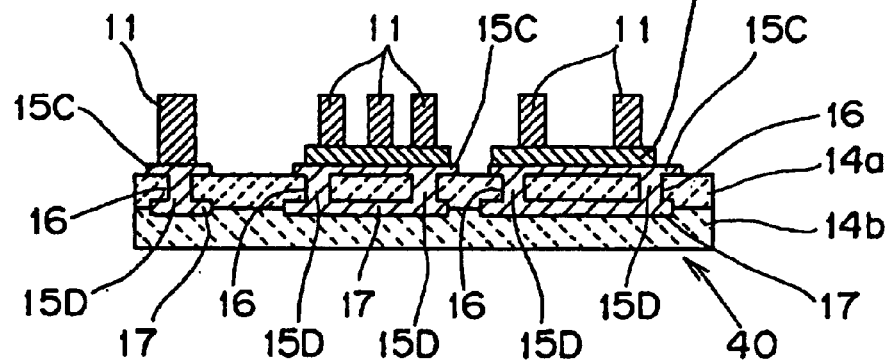
FIG. 6 is a sectional view of a semiconductor package according to a fourth embodiment of the present invention assumed to be cut along a line B-B' of FIG. 4.

A semiconductor package according to a fourth embodiment of the present invention will be described with reference to FIG. 6. FIG. 6 is a sectional view of a multilayer ceramic radiating plate 40.

The semiconductor package in the fourth embodiment has a radiating plate 40 formed of ceramic layers 14a and 14b. A semiconductor 1 and electrodes for pillared or spherical electrodes are formed of a single one of or a combination of gold, silver, copper, nickel, and tungsten on a front face of the radiating plate 40, and conductive layers to be connected to the electrodes of the front face are formed, of material equal to a material of the electrodes of the front face, between the ceramic layers 14a and 14b of the radiating plate 40. Heat of the semiconductor 1 is accordingly radiated by both the ceramic layers 14a, 14b, and the conductive layers.

A method for forming the plate 40 is not different from generally performed methods. For instance, in the case where the radiating plate 40 is constituted of an upper ceramic layer or plate 14a and a lower ceramic layer or plate 14b, holes 16 are formed in the upper ceramic plate 14a and electric circuit(s) 15C are formed on a front face of the upper ceramic plate 14a. Moreover, material equal to a material of the electric circuit(s) 15C is filled into the holes 16, thereby forming conductive portions 15D. In the meantime, electric circuits of a necessary area are formed as internal conductors 17 on a front face of the lower ceramic plate 14b. Thereafter, the upper ceramic plate 14a and lower ceramic plate 14b are united while the conductive portions 15D of the upper ceramic plate 14a are electrically joined with the internal conductors 17 of the lower ceramic plate 14b, as shown in FIG. 6. The ceramic plate 14a and ceramic plate 14b are united via use of an adhesion force generated as a result of drying and baking a conductive paste used for forming the electric circuit(s) 15C, conductive portions 15D and the internal conductors 17, or via use of another adhesive so that the ceramic plate 14a and ceramic plate 14b are joined to each other. Another method uses a ceramic green sheet, in which the above upper and lower ceramic plates 14a and 14b are replaced with ceramic green sheets. After the same process as above, the ceramic green sheets and conductive paste are simultaneously baked and united at 600–1600° C. The semiconductor 1 and pillared or spherical electrodes 11 are mounted to the thus-formed ceramic radiating plate 40, whereby the semiconductor package is completed as indicated in FIG. 6.

In this case, heat generated at the semiconductor 1 is directly transmitted to the electric circuits 15C and to the internal conductors 17 via the conductive portions 15D inside the holes 16 further to the ceramic plate 14b. The heat is radiated from a lower surface of the lower ceramic plate 14b. Although the radiating plate 40 in the figure is constituted of two ceramic plates 14a and 14b, ceramic plates can be overlapped in many layers by repeating the above process.

Normally, transmission of heat is carried out not only via the conductive portions 15D in the holes 16, but through every joined part.

In the arrangement, the radiating plate 40 is constructed in a layered structure of ceramic, while having the semiconductor 1 and the electrodes for the pillared or spherical electrodes 11 formed of a single one of or a combination of gold, silver, copper, nickel, and tungsten on a front face thereof. Conductive portions 15C, 15D, and 17, of the same material as that of the electrodes of the front face, are formed between the ceramic layers to be connected with the electrodes of the front face, so that heat is radiated both from the ceramic radiating plate 40 and the conductive portions 15C, 15D, and 17. More specifically, a heat conduction performance of the metal is utilized in order to improve heat radiation efficiency of the ceramic of the radiating plate 40. In addition, the conductive portions 15D and internal conductors 17 are set as a heat-transmitting metallic layer inside the ceramic of the radiating plate 40 to be connected to the electric circuit(s) 15C of the front face of the radiating plate 40 connected with the semiconductor 1 in order to transmit heat generated at the semiconductor 1 as fast as possible to the entirety of the radiating plate 40. Heat can thus be transmitted from the electric circuit(s) 15C through the conductive portions 15D and the internal conductors 17 to the lower ceramic plate 14b. Heat diffusion efficiency can be improved and heat radiation efficiency can also be improved.

(FIFTH EMBODIMENT)

In a semiconductor package according to a fifth embodiment of the present invention, the radiating plate is formed of any one of copper, a copper alloy, aluminum, and an aluminum alloy, or the one metal after subjected to surface treatment. Since copper, a copper alloy, aluminum, or an aluminum alloy has good processability to allow various working methods of cutting, casting, and the like, a large degree of freedom in shape is effectuated and a use range is enlarged in combination with the surface treatment.

As above, when the radiating plate is formed of any one of copper, a copper alloy, aluminum, and an aluminum alloy or the one metal thereof after subjected to the surface treatment, if one semiconductor is to be mounted, or a plurality of semiconductors including lower face electrodes of equal current and voltage characteristics are to be mounted, the radiating plate itself may be a conductor. Since the above materials transmit heat and electricity well, diffuses heat fast, and is easy to solder to other metals, heat of the semiconductor can be radiated more effectively.

(SIXTH EMBODIMENT)

A semiconductor package of a sixth embodiment of the present invention will be described with reference to FIGS. 7A and 7B.

Figure 7A:
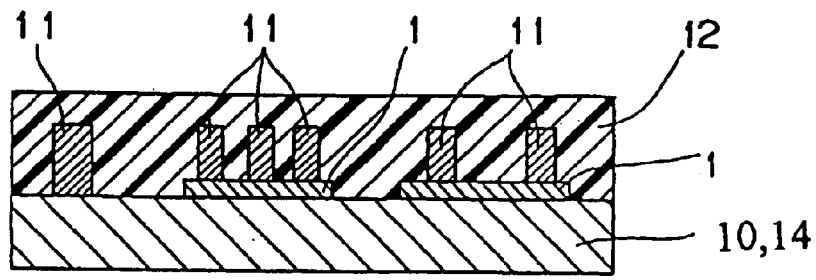
FIGS. 7A and 7B are sectional views of a semiconductor package according to a sixth embodiment of the present invention.
Figure 7B:
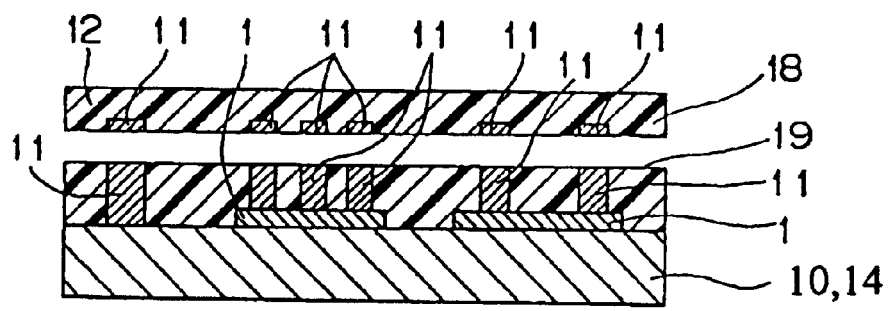

The semiconductor package of the sixth embodiment of the present invention is obtained by covering pillared or spherical electrodes 11 with sealing resin 12 as shown in FIG. 7A, and then simultaneously removing part of the sealing resin 12 and part of the pillared or spherical electrodes 11 to expose electrode parts of the pillared or spherical electrodes 11, thereby forming connecting parts as shown in FIG. 7B.

More specifically, in FIG. 7A, a semiconductor 1 and the pillared or spherical electrodes 11 mounted on an electric circuit of a metallic radiating plate 10, or ceramic radiating plate 14, are covered with the sealing resin 12 with use of a mold or a jig as described in the second embodiment. The sealing resin 12 is applied by in amount at least covering leading end parts of the pillared or spherical electrodes 11, preferably, an amount whereby a margin is provided at the leading end parts as indicated in FIG. 7A. Thereafter, In FIG. 7B, a part 18, that is an upper part of the pillared or spherical electrodes 11, and part of the sealing resin 12 formed in FIG. 7A is removed, whereby a smooth face 19 is formed and end faces of the pillared or spherical electrodes 11 are exposed.

The part 18 is removed by cutting by means of a rotating or reciprocating cutting tool, or rotating an abrasive paper.

The removal is carried out on the basis of a lower face of the metallic radiating plate 10 or ceramic radiating plate 14, whereby a total height is uniform without the need of carefully taking in account the amount of the scaling resin 12.

According to this constitution, part of the sealing resin 12 and part of the pillared or spherical electrodes 11 are removed at the same time after the pillared or spherical electrodes 11 are covered with the sealing resin 12, thereby exposing the electrode parts of the pillared or spherical electrodes 11 to form the connecting parts. Electrodes are accurately uniform in height. In other words, although it is considerably difficult to make uniform a plurality of electrodes 11 in height when the pillared or spherical electrodes 11 are set on the electric circuit of the semiconductor 1 and the metallic radiating plate 10 or ceramic radiating plate 14, all the electrodes 11 can be made uniform in height by removing part of all electrodes 11 together with part of the sealing resin 12, so that an accuracy necessary for mounting can be fully satisfied.

(SEVENTH EMBODIMENT)

Figure 8A:
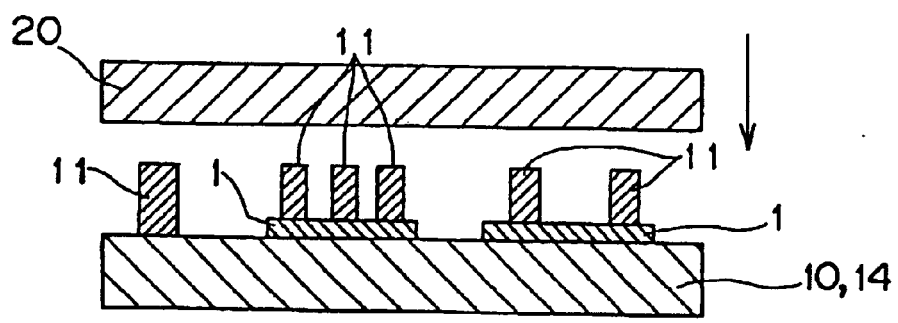
FIGS. 8A and 8B are sectional views of a semiconductor package according to a seventh embodiment of the present invention.

A semiconductor package according to a seventh embodiment of the present invention will be discussed with reference to FIGS. 8A and 8B. The semiconductor package of the seventh embodiment of the present invention has pillared or spherical electrodes 11 joined to semiconductors 1 and a metallic radiating plate 10 or ceramic radiating plate 14, or sealed with sealing resin 12, and pressed smoothly thereafter.

The pillared or spherical electrodes 11 joined to the semiconductors 1 and the metallic radiating plate 10 or ceramic radiating plate 14 are not always constant in height because of working errors of individual parts to be joined to each other, and processing errors at the time of joining the parts. However, the pillared or spherical electrodes 11 are preferably uniform in height as much as possible when to be mounted to a circuit board. Therefore, leading end parts of the pillared or spherical electrodes 11 are pressed to be deformed by a smoothing plate 20 having a smooth face, thereby providing a uniform height. FIG. 8A is a diagram of a state in which the electrodes are pressed in the absence of the sealing resin 12, whereby a pressure of the pressing is directly transmitted to joined parts via the semiconductors 1 because of no sealing resin 12. As such, the pressing force should be determined with breakage of the semiconductors 1 being taken into consideration.

Figure 8B:
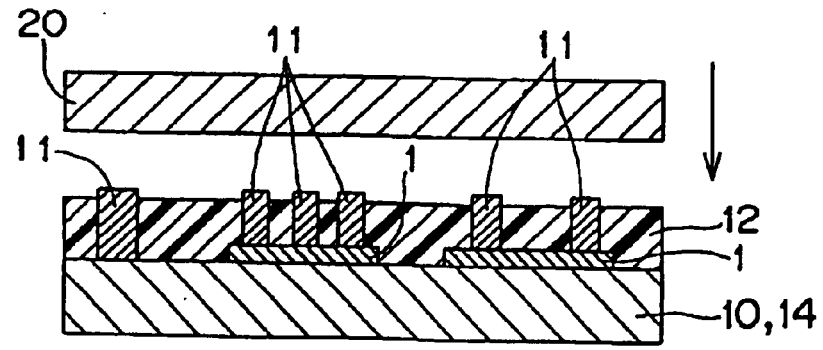

In FIG. 8B, the pillared or spherical electrodes 11 are covered with the sealing resin 12 in a manner to expose leading end parts of the electrodes 11 by performance of the method in the above-described second embodiment or the like. The pillared or spherical electrodes 11 are pressed by the smoothing plate 20 and deformed at the exposed parts, thereby being made uniform in height. In this case, a large pressing force is required because the pillared or spherical electrodes 11 include only a small part that can be deformed. However, because the pressing force is supported by the sealing resin 12 and dispersed, the pressing force is prevented from being directly transmitted to the semiconductors 1. The semiconductors 1 are accordingly less damaged in comparison with the process depicted by FIG. 8A. An allowance for a set value of the pressing force can be made large as compared with FIG. 8A, and workability is improved.

According to the above construction, the smooth pressing is conducted after the pillared or spherical electrodes 11 are joined to the semiconductors 1 and the metallic radiating plate 10 or ceramic radiating plate 14, or sealed with the sealing resin 12. The constitution of the embodiment can exhibit the same effects as the sixth embodiment. The pillared or spherical electrodes 11 can be easily made uniform in height by deforming the electrodes 11 through pressing with use of a jig or a mold having a smooth face.

(EIGHTH EMBODIMENT)

A semiconductor package according to an eighth embodiment of the present invention will be described with reference to FIGS. 9A, 9B, and 9C, which are sectional views 11 by way of example of a pillared or spherical electrode 11 of the eighth embodiment of the present invention.

In the eighth embodiment, the pillared electrode 11 is formed of a double structure of different materials. A material constituting an inside and a material constituting an outside are different in hardness.

Figure 9A:
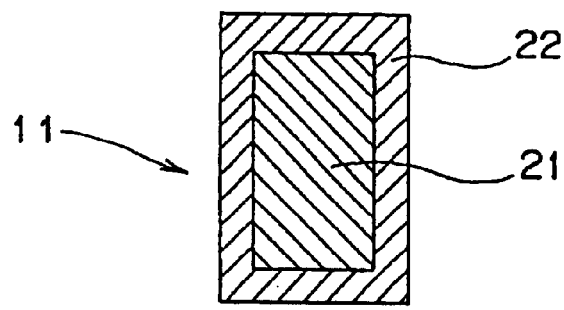
FIGS. 9A, 9B, and 9C are sectional views of a semiconductor package according to an eighth embodiment of the present invention.
Figure 9B:
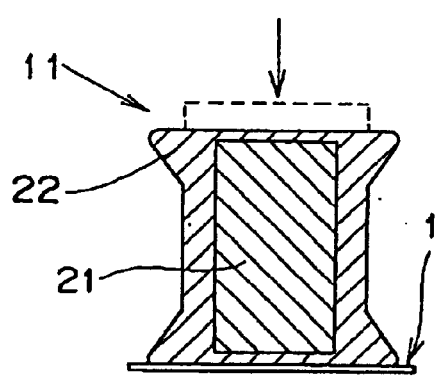
Figure 9C:
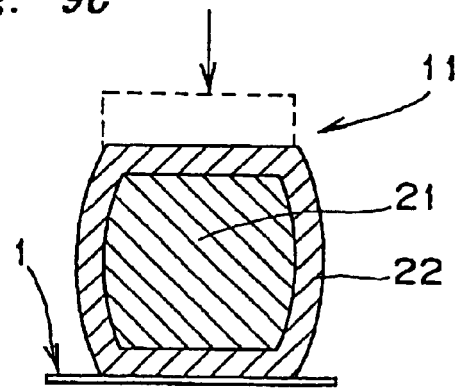
Figure 14:
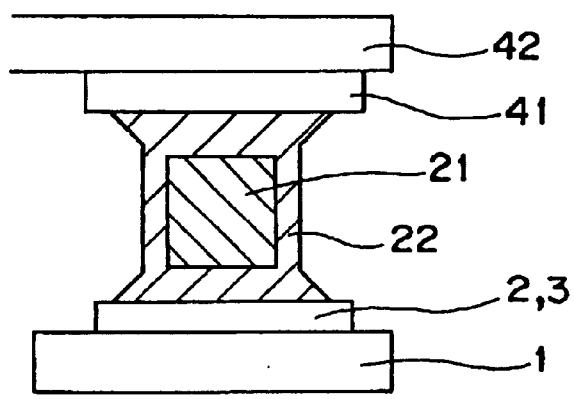
FIG. 14 is a sectional view showing a state of joining a circuit board and a semiconductor element with use of the semiconductor package of one example of the eighth embodiment of the present invention.
Figure 16:
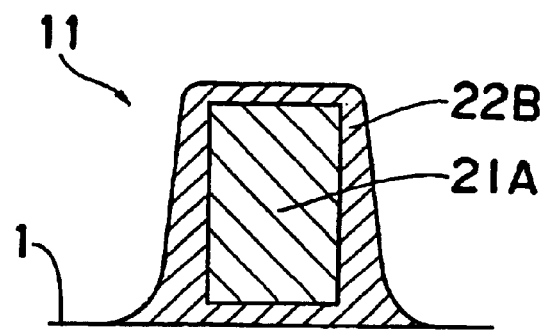
FIGS. 16, 17, and 18 are sectional views of semiconductor packages according to other examples of the eighth embodiment of the present invention.
Figure 17:
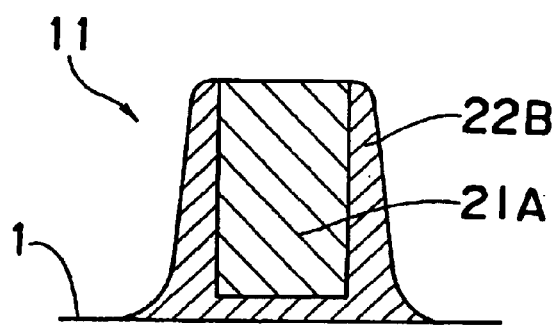
Figure 18:
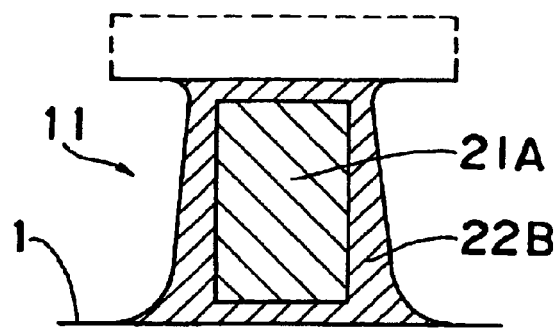

The pillared electrode 11 in a first example of the eighth embodiment is in the double structure as shown in FIG. 9A, having a hard inside and a soft outside, or as shown in FIGS. 16–18, having the outside formed of a material of a lower melting temperature than the material of the inside. More specifically, FIG. 9A shows the pillared electrode 11 in section, which is formed of an inner member 21 and an outer member 22. The inner member 21 is obtained by cutting a wire or bar stock of copper or a copper alloy to a constant size and finishing a surface smoothly by barrel finishing or the like. The outer member 22 is obtained by plating a material softer than copper, i.e., solder, tin, an alloy of tin and bismuth, or an alloy of tin and lead, to a front face of the inner member 21. A plating thickness of the outer member 22 is, e.g., approximately 20–100 μm. When the electrode is pressed in an arrow direction in FIG. 9I at the time of being joined to a substrate, upper and lower soft plated parts of the outer member 22 are deformed as illustrated in FIGS. 9B and 14, whereas a hard part of the inner member 21 is not deformed. The entirety of the pillared electrode 11 is prevented from being largely deformed and maintains its shape. In FIG. 14, 42 is a base material and 41 is a copper electrode, which constitute a circuit board 5. Metal diffusion is brought about at a part where outer member 22 and the copper electrode 41 are in contact with each other, and a part where the outer member 22 and aluminum electrode 2 or 3 are in contact with each other. In the constitution of the electrode, a height of the electrode can be determined accurately and a high rigidity can be secured. The plating thickness of the outer member 22 is set to be not smaller than 20 μm because this is a minimum value (minimum value from experiments) whereat the plated part is started to be deformed, and a minimum value necessary for absorbing height variation. A plating thickness of not larger than 100 μm of the outer member 22 is set because this value is generally considered as a maximum plating thickness.

FIGS. 16–18 show the pillared electrodes 11 in section, each of which is formed of an inner member 21A and an outer member 22B. The inner member 21A is obtained by cutting a wire or bar stock of copper (melting point of 1084.5° C.), aluminum (melting point of 660.4° C.), or gold (melting point of 1064.43° C.) to a constant size and finishing a surface smoothly by barrel finishing or the like. The outer member 22B is obtained by plating colder (melting point of 180–300° C.) such as Sn-Ag-Cu-based, Sn-Cu-based, Sn-Au-based, Sn-Bi-based, or Sn-Pb-based solder, as a material having a melting point lower than that of the inner member 21A, to a front face of the inner member 21A. Because of the solder of the outer member 22B, the joining strength can be further improved. Even in this case, similar to FIG. 9A, when the electrode is pressed in the arrow direction in FIG. 9B at the time of being joined to a substrate, upper and lower plated parts of the outer member 22B are deformed similar to that as shown in FIGS. 9B and 14, whereas the inner member 21A is not deformed. The entirety of the pillared electrode 11 is prevented from being largely deformed and maintains its shape. A dotted line in FIG. 18 shows an electrode of a circuit board.

Figure 15:
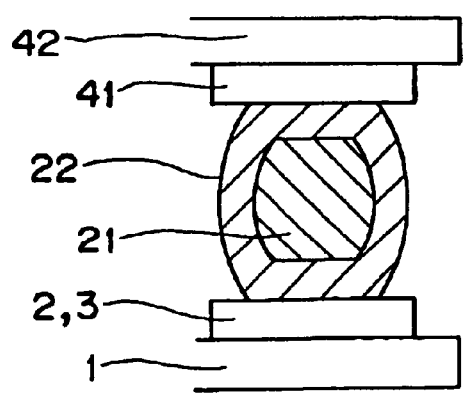
FIG. 15 is a sectional view of a state of joining a circuit board and a semiconductor element with use of the semiconductor package of another example the eighth embodiment of the present invention.

Alternatively, in a second example of the eighth embodiment, materials of the inner member 21 and outer member 22 are switched; that is, the inner member 21 is formed of a wire or rod stock softer than copper, namely, any one of tin, a tin-bismuth alloy, and a tin-lead alloy, which is cut to a constant size and finished smoothly at a front face by barrel finishing or a like manner. Then, a plated layer of a material harder than the material of the inner member 21, i.e., copper or a copper alloy is formed as the outer member 22 on a surface of the inner member 21 at a thickness of approximately 3–50 cm by performing a plating operation. The outer member 22 is prevented from being broken when pressured in an arrow direction of FIG. 9C and, eventually deformed as shown in FIGS. 9C and 15. 42 and 41 in FIG. 15 are respectively a base material and a copper electrode which constitute a circuit board 5. Metal diffusion is brought about at a contact part between outer member 22 and the copper electrode 41, and a contact part between the outer member 22 and aluminum electrode 2 or 3. According to the constitution, an irregularity in height of the circuit board can be absorbed, and also a uniform pressure is applied to electrodes through the deformation, even when a plurality of electrodes are pressed at one time for performing a joining operation. Different from the foregoing example, the plating thickness of the outer member 22 is set to be not smaller than 3 μm, because the inner member 21 is deformed, thereby eliminating the need of deforming the outer member 22. The metal diffusion can be generated well by having the thickness be not smaller than 3 μm without breaking the outer member 22. At the same time, a thickness of not larger than 50 μm is set because a value approximately half of the plating thickness 100 μm of the outer member 22 is considered appropriate.

When the pillared electrode 11 is constituted as in the above first example or second example, the electrode is hard to deform during a joining operation or the like, whereas the electrode is easy to deform when a height adjustment is required. Excessive pressing by the smoothing plate 20 is thus not required to adjust the height of the pillared electrode of the seventh embodiment, so that damage to the semiconductors 1 is eliminated. Furthermore, the work done by the smoothing plate 20 is reduced and the electrode can be deformed with a small amount of pressing when mounted to a circuit board. The height can be adjusted with an error at the side of the circuit board being absorbed.

With any deformation of the pillared electrodes 11 of the first example and second example, the height adjustment can be by approximately 5–30 μm.

As decribed hereinabove, according to the first example of the eighth embodiment, the pillared or spherical electrode 11 is of a double structure having a soft inside and hard outside, or of a double structure having the outside formed of a material having a lower melting temperature than that of the material of the inside. In the pillared or spherical electrodes 11 comprised of the inside being copper or a copper alloy and the outside being a soft material of any of tin, a tin-bismuth alloy, and a tin-lead alloy, the soft outer member 22 is deformed at the time of being joined to a circuit board, whereas the inner member 21 is supported and not deformed due to being hard copper or a hard copper alloy. The pillared or spherical electrodes 11 show no great deformation as a whole, with a smoothness secured at leading end parts thereof.

The smoothness can be secured by adjusting the height through smoothly pressing and deforming the electrodes in a heightwise direction, thereby coping with a height irregularity of the electrodes at the side of the circuit board when the electrodes are mounted, as a semiconductor package, to the circuit board. In other words, the height irregularity of the electrodes is absorbed on the circuit board.

According to the second example of the eighth embodiment, the pillared or spherical electrode 11 is of a double structure having a soft inside and hard outside, or of a double structure having the outside of a material of a higher melting temperature than that of the material of the inside. The same effect as in the first example can be obtained even by switching with each other the materials of the inside and the outside of the pillared or spherical electrode 11.

(NINTH EMBODIMENT)

Figure 10:
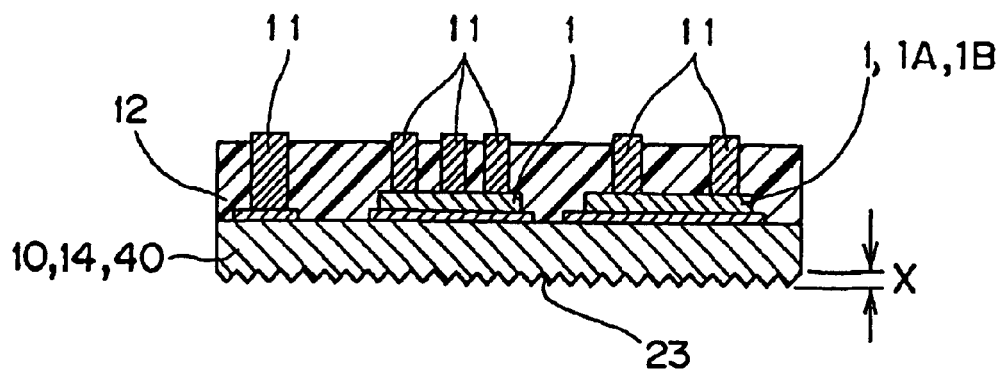
FIG. 10 is a sectional view of a semiconductor package according to a ninth embodiment of the present invention.

A semiconductor package according to a ninth embodiment of the present invention will be described with reference to FIG. 10. In the ninth embodiment of the present invention, pits and projections are formed on a face of a radiating plate that is opposite to the face joined to the semiconductor so as to increase surface area thereof, resulting in improving a heat radiation effect.

In any of a metallic radiating plate 10 and ceramic radiating plates 14, 40, pits and projections 23 are formed on a face opposite (lower face in FIG. 10) a face (upper face in FIG. 10) where pillared or spherical electrodes 11 are mounted to semiconductors 1, 1A, 1B. Because of the presence of the pits and projections 23 on this face, a surface area is increased and a contact area with air is increased, so that a heat radiation effect is improved. That is, instantaneously generated heat of the semiconductors 1, 1A, 1B is absorbed by a part of a large volume density without the pits and projections 23 (namely, the face of the radiating plate where the semiconductors are mounted). Then, heat is conducted and transmitted to the pits and projections 23 and radiated from surfaces of the pits and projections 23. Although a sectional shape of the pits and projections 23 is illustrated to be nearly triangular in FIG. 10, the shape is not limited particularly to a triangle and can be rectangular, of a corrugated form, or other forms.

When the pits and projections 23 are formed on the face opposite the face of the radiating plate 10, 14, 40 where the semiconductors 1, 1A, 1B are joined, the surface area of the radiating plate 10, 14, 40 is increased, co that the heat radiation effect can be improved. Since the contact area with air is increased, an amount of heat of the radiating plate 10, 14, 40 to be radiated into the air is increased, thereby promoting the heat radiation effect.

(TENTH EMBODIMENT)

Figure 11A:
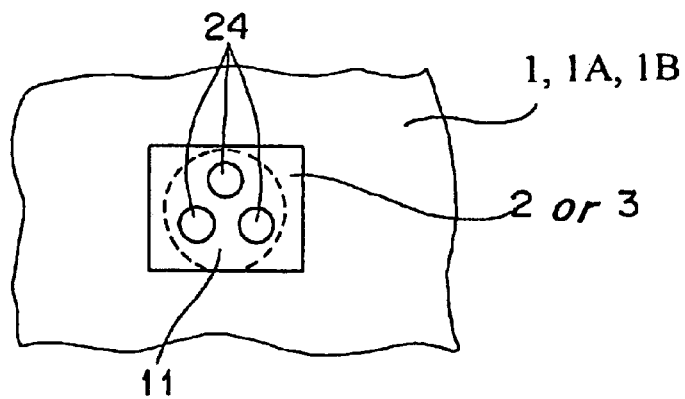
FIGS. 11A and 11B are a plan view and a sectional view of a semiconductor package according to a tenth embodiment of the present invention.
Figure 11B:
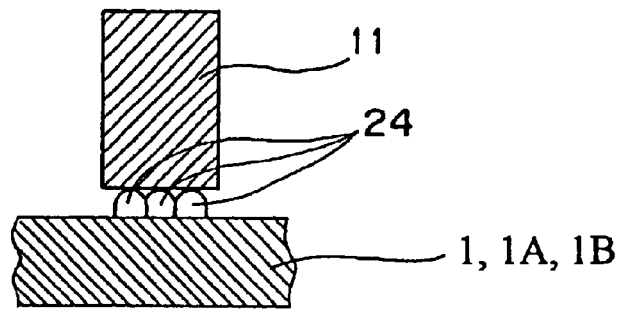
Figure 12:
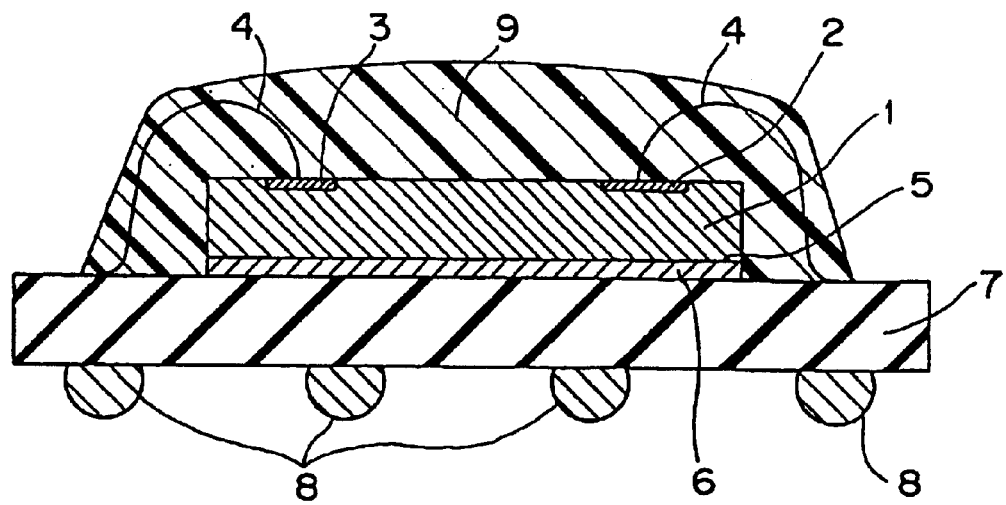
FIG. 12 is a sectional view of a semiconductor package of the prior art.

A semiconductor package according to a tenth embodiment of the present invention will be described with reference to FIGS. 11A and 11B.

In the tenth embodiment of the present invention, a plurality of bumps 24 are formed on each of an upper face first electrode 2 (upper a electrode) and upper face second electrode 3 (upper b electrode) of semiconductors 1, 1A, 1B (represented by the semiconductor 1 in the description below) and then, pillared or spherical electrodes 11 are joined to the plurality of bumps 24. The bumps 24 are not limited to gold, but may be formed of copper or aluminum. In the case of gold bumps 24, height stability can be easily ensured. In the case of copper bumps 24, electrical resistance and cost can be decreased. In the case of aluminum bumps 24, processability can be improved.

A plurality of gold bumps 24 are formed on the upper face first electrode 2 (upper a electrode) and the upper face second electrode 3 (upper b electrode) of the semiconductors by a bump formation method using general ultrasonic oscillation. The bumps 24 are preferably formed to be scattered as much as possible on the upper face first electrode 2 (upper a electrode) and the upper face second electrode 3 (upper b electrode), and in a range not larger than a bottom area of the pillared or spherical electrode 11. If the bumps 24 are formed in an unbalanced state and concentrated to one side, the pillared or spherical electrode 11 is sometimes inclined during mounting of the pillared or spherical electrode 11, or a connection are of the pillared or spherical electrode 11 is apt to be reduced, leading to a connection failure.

A sectional shape of each bump 24 is not specified. A variation of approximately 10 μm in height of the bumps 24 generated when formed is allowed because the bumps are pressed and crushed when the pillared or spherical electrode 11 is mounted. However, for enhancing an effect in height adjustment when the pillared or spherical electrodes 11 are mounted, the bumps are preferably formed as high as possible and no particular problem is brought about when the height is 50 cm or more.

According to the above construction, after the plurality of bumps 24 are formed on each of the upper face first electrode 2 (upper a electrode) and the upper face second electrode 3 (upper b electrode) of the semiconductor 1, the pillared or spherical electrodes 11 are joined to the bumps 24. As compared with the case where large electrodes, i.e., pillared or spherical electrodes 11 are directly joined to the upper face first electrode 2 (upper a electrode) and the upper face second electrode 3 (upper b electrode) of the semiconductor 1, the semiconductor 1 is less damaged when the semiconductor 1 has small gold bumps 24 formed via ultrasonic oscillation. When the pillared or spherical electrodes 11 are mounted on the bumps 24 via ultrasonic oscillation, the bumps 24 are deformed thereby lessening a load applied to the semiconductor 1 and adjusting the height of the bumps. Each gold bump 24 has good solderability, enabling its joining to the pillared or spherical electrodes 11 by solder.

In each of the above-described embodiments, the lower face electrode of the semiconductor 1, 1A, 1B is joined with use of the solder to the radiating plate 10, 14, 40, and moreover the pillared or spherical electrodes 11 are joined to the upper electrodes of the semiconductor and the radiating plate. The semiconductor package is of high reliability can be consequently easily and stably formed. More specifically, the electrode on one face of each semiconductor 1, 1A, 1B, is directly joined to the radiating plate 10, 14, 40, so that heat of the semiconductor 1, 1A, 1B can be quickly absorbed and diffused, with a heat radiation effect improved. At the same time, since the pillared or spherical electrodes 11 thicker than a wire used in wire bonding, and of a larger current capacity than the wire, are employed for the connection, the pillared or spherical electrodes 11 can be utilized as connecting terminals for a circuit board.

In the case of the insulating ceramic radiating plate 14, 40, having an insulating function, semiconductors 1A and 1B of different functions can be mounted simultaneously.

The present invention is not limited to the foregoing embodiments and can be executed in other various modes.

For example, each of the above embodiments is primarily related to the case where one semiconductor 1 is mounted on the metallic or ceramic radiating plate 10, 14, 40. If a plurality of semiconductors of the same kind are mounted, or a plurality of semiconductors 1A and 1B of different types are mounted, a circuit of a wide range can be formed to be small with a higher efficiency than when one semiconductor 1 is mounted. If a plurality of semiconductors are mounted, wiring between semiconductor elements, i.e. ICs, becomes short to a lower an impedance, whereby an electric high frequency transmission loss is reduced and an efficiency can be improved. When an electronic circuit module used in combination with a predetermined plurality of ICs is Incorporated in one package, a ratio of dead space decreases and the dead space becomes small. In other words, for example. In the case where two kinds of semiconductors for a transistor and for a diode are to be used, the semiconductors pair in terms of an electronic circuit to be used, and therefore, leads of the above package can be reduced to three although the semiconductors in different packages require five leads. The circuit of a large range can accordingly be formed to be small.

One example where the semiconductor package of the embodiment is applied to actual products, are power modules such as motors for industrial use, such as AC servo motors, usable for robots or component mounting apparatus. Specifically, such a motor has a motor output of 100–200 W, a normal calorific value of 10–20 W, a load or abnormal calorific value of 20–100 W or 20–200 W, performs a switching conversion function of a semiconductor element at normal time and an accelerating and decelerating motion at loading time, and causes a locking motion of the motor's rotary shaft at abnormal time. In this case, each electrode has the following outer diameter and height: 1 mm-diameter of each electrode at a substrate side and a semiconductor element side, 1 mm-height at the substrate side, and 0.5 mm-height at the semiconductor element side. The shape of each electrode is columnar. The load voltage of the semiconductor element is 200V, and the current is 1–5 A. Taking into account insulating properties, a distance between adjacent electrodes having different potentials is at least 0.4 mm, and the electrodes are preferably coated with an insulating resin.

As above, according to the present invention, the lower face electrodes of semiconductors, each having electrodes formed on both upper and lower face, are joined with use of solder to the radiating plate, and moreover, pillared or spherical electrodes are joined to the upper face electrodes of the semiconductor and the radiating plate. The semiconductor package constituted from one or a plurality of semiconductors can be formed in a simple structure with a superior heat radiation effect and of a stable quality.

Concretely, since the lower face electrodes of the semiconductors are joined to the radiating plate, heat generated at the semiconductor can be directly transmitted to the radiating plate. Moreover, the upper face first, electrode (upper a electrode) and the upper face second electrode (upper b electrode) of the semiconductor are joined to the radiating plate with use of the pillared or spherical electrodes, which are thicker than a gold or aluminum wire used for wire bonding and are hard to deform after the joining. Other ends of the pillared (columnar) or spherical electrodes can be utilized as connecting parts to a circuit board. Accordingly, the present invention provides a semiconductor package which can cope with a large current, can easily improve heat radiation efficiency and secure a distance between electrodes. A semiconductor of a large operating current and voltage, and a large heat amount, can be mounted compactly, inexpensively and highly reliably, and can be manufactured stably.

When the semiconductor and the face of the radiating plate joined to the semiconductor are covered with a sealing resin in a manner to expose part of leading ends of the pillared or spherical electrodes, each component can be protected from deformation, damage, moisture, dust, and the like, and becomes easy to handle as a semiconductor package after completion.

When independent electric circuits of a plurality of polarities of a single one of or combination of gold, silver, copper, nickel, and tungsten are arranged on a ceramic radiating plate, and semiconductors of different kinds are joined to the electric circuits of the plurality of polarities of the radiating plate, the plurality of polarities can be formed independently of each other on the same face of the radiating plate with utilization of insulating properties heat conduction, and heat radiation properties of the ceramic.

When the radiating plate is formed of a multilayer ceramic structure having semiconductors, and electrodes for the pillared or spherical electrodes are formed of a single one or of combination of gold, silver, copper, nickel, and tungsten, on the front face thereof, and also when the radiating plate has conductive layer, formed of the same material as that of the electrodes on the front face between the ceramic layers to be connected to the electrodes on the front face to radiate heat from both the ceramic radiating plate and the conductor layers; heat generated at the semiconductors can be transmitted from the electric circuits through the conductive layers and internal conductors to a lower ceramic plate with utilization of heat conduction properties of the metal. Accordingly, heat diffusion efficiency is improved and heat radiation efficiency can also be improved.

In the case where one semiconductor is to be mounted, or a plurality of semiconductors having lower face electrodes of equal current and voltage characteristic are to be mounted, the radiating plate itself can be a conductor. If the radiating plate is formed of any one of copper, a copper alloy, aluminum, and an aluminum alloy, or the radiating plate is formed of this metal after being subjected to a surface treatment, the material forming the radiating plate transmits heat and electricity well, diffuse heat quickly and is easy to solder to other metals, so that a heat radiation effect for the semiconductors can further be effectuated.

When part of a sealing resin and part of the pillared or spherical electrodes are removed simultaneously after the pillared or spherical electrodes are covered with the sealing resin, thereby exposing electrode parts to form connecting parts, the pillared or spherical electrodes can be accurately made uniform in height.

When the pillared or spherical electrodes are pressed to be smooth after being joined to the semiconductors and a metallic radiating plate, or after being scaled with the scaling resin, the pillared or spherical electrodes are easily deformed to be uniform in height when pressured with use of a jig having a smooth face or a mold having a smooth face.

In the case where the pillared or spherical electrodes are formed of a double structure having a hard inside and soft outside, or of a double structure having the outside be of a material having a lower melting temperature than that of the material of the inside, although the soft outside of the pillared or spherical electrodes is deformed when joined to a circuit board, the pillared or spherical electrodes are prevented from being largely deformed as a whole because of being supported by the hard inside material, whereby a smoothness can be secured at the leading end parts of the pillared or spherical electrodes.

If a radiating plate is provided with pits and projections on a face opposite a face joined to semiconductors, the radiating plate has a larger surface area, thus improving a heat radiation effect and, also increasing a contact area with air, thereby increasing an amount of heat of the radiating plate radiated to the air. Thus, the heat radiation effect can be promoted.

In an arrangement in which a plurality of bumps are arranged on each of an upper face first electrode (upper a electrode) and an upper face second electrode (upper b electrode) of a semiconductor, with pillared or spherical electrodes being joined to the bumps, the semiconductor can be less damaged because the bumps are small gold bumps formed via ultrasonic oscillation, as opposed to when large pillared or spherical electrodes are directly joined to the upper face first electrode (upper a electrode) and the upper face second electrode (upper b electrode) of the semiconductor. Setting the pillared or spherical electrodes on the bumps via ultrasonic oscillation can lessen a load to the semiconductor because of the deformation of the bumps, and can adjust the height of the bumps. Gold bumps are good in solderability, thereby enabling their joining to the pillared or spherical electrodes via a solder.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A semiconductor package comprising:
a first semiconductor having at least one upper face electrode on an upper face of said first semiconductor, and a lower face electrode on a lower face of said first semiconductor, said first semiconductor being sealed by resin;
a heat radiating plate having a surface to which is joined said lower face electrode via solder or conductive paste, with said solder or conductive paste being in contact with said lower face electrode; and
pillared electrodes joined to said at least one upper face electrode and said heat radiating plate, respectively, with leading ends of said pillared electrodes being exposed so as to constitute electric connecting parts, and with said leading ends of said pillared electrodes extending to a uniform height relative to one another.

2. The semiconductor package according to claim 1, wherein said resin comprises a sealing resin covering said first semiconductor and said surface of said heat radiating plate, but not covering said leading ends of said pillared electrodes.

3. The semiconductor package according to claim 1, further comprising a second semiconductor having at least one upper face electrode on an upper face of said second semiconductor, and a lower face electrode on a lower face of said second semiconductor, with said second semiconductor being the same as said first semiconductor and with said lower face electrode of said second semiconductor being joined to said heat radiating plate via solder or conductive paste, and
wherein said heat radiating plate comprises ceramic and has an electric circuit of equal polarity formed from at least one of gold, silver, copper, nickel and tungsten, with said electric circuit being on said ceramic and with said first and second semiconductors being joined to said electric circuit.

4. The semiconductor package according to claim 1, further comprising a second semiconductor having at least one upper face electrode on an upper face of said second semiconductor, and a lower face electrode on a lower face of said second semiconductor, with said second semiconductor exhibiting different characteristics relative to said first semiconductor and with said lower face electrode of said second semiconductor being joined to said heat radiating plate via solder or conductive paste, and
wherein said heat radiating plate comprises ceramic and has electric circuits of independent polarities formed from at least one of gold, silver, copper, nickel and tungsten, with said electric circuits being on said ceramic and with said first and second semiconductors being joined to said electric circuits, respectively.

5. The semiconductor package according to claim 1, wherein
said heat radiating plate has a circuit for said first semiconductor and said pillared electrodes, with said circuit being formed from at least one of gold, silver, copper, nickel and tungsten and being provided on a front surface of said heat radiating plate, and
said heat radiating plate comprises ceramic layers separated by a conductive layer that is of a material equal to a material of said circuit, with said conductive layer being connected to said circuit such that heat of said first semiconductor is to be radiated by said ceramic layers and said conductive layer.

6. The semiconductor package according to claim 1, wherein said heat radiating plate comprises at least one of copper, a copper alloy, aluminum and an aluminum alloy, with or without being subjected to a surface treatment.

7. The semiconductor package according to claim 1, wherein said leading ends of said pillared electrodes are exposed by covering said pillared electrodes with said resin and then simultaneously removing a portion of said resin and a portion of said pillared electrodes.

8. The semiconductor package according to claim 1, wherein said leading ends of said pillared electrodes joined to said at least one upper face electrode and said heat radiating plate extend to a uniform height relative to one another by being smoothly pressed.

9. The semiconductor package according to claim 1, wherein each of said pillared electrodes comprises an inner portion and an outer portion, with said inner portion being of a hardness that is different than a hardness of said outer portion.

10. The semiconductor package according to claim 1, wherein each of said pillared electrodes comprises an inner portion and an outer portion, with said inner portion having a melting temperature that is different than a melting temperature of said outer portion.

11. The semiconductor package according to claim 1, further comprising a second semiconductor having at least one upper face electrode on an upper face of said second semiconductor, and a lower face electrode on a lower face of said second semiconductor, with said second semiconductor exhibiting different characteristics relative to said first semiconductor, with said lower face electrode of said second semiconductor having current and voltage characteristics that are equal to current and voltage characteristics of said lower face electrode of said first semiconductor, and with said lower face electrode of said second semiconductor being joined to said heat radiating plate via solder or conductive paste as is said lower face electrode of said first semiconductor such that said first and second semiconductors are mounted on said heat radiating plate.

12. The semiconductor package according to claim 1, wherein said heat radiating plate includes pits and projections on a surface that is opposite said surface to which said lower face electrode is joined.

13. The semiconductor package according to claim 1, further comprising bumps between said at least one upper face electrode and one of said pillared electrodes joined to said at least one upper face electrode.

14. The semiconductor package according to claim 8, wherein all of said leading ends of said pillared electrodes joined to said at least one upper face electrode and said heat radiating plate extend to a uniform height relative to one another by being smoothly pressed.

15. A semiconductor package comprising:
a first semiconductor having at least one upper face electrode on an upper face of said first semiconductor, and a lower face electrode on a lower face of said first semiconductor;
a heat radiating plate having a surface to which is joined said lower face electrode via solder or conductive paste; and
pillared electrodes joined to said at least one upper face electrode and said heat radiating plate, respectively, with leading ends of said pillared electrodes being exposed so as to constitute electric connecting parts, wherein said leading ends of said pillared electrodes joined to said at least one upper face electrode and said heat radiating plate are equally spaced from said surface of said heat radiating plate relative to one another, and wherein each of said pillared electrodes comprises an inner portion and an outer portion, with said inner portion being of a hardness that is different than a hardness of said outer portion.

16. The semiconductor package according to claim 15, wherein all of said leading ends of said pillared electrodes joined to said at least one upper face electrode and said heat radiating plate are substantially equally spaced relative to one another from said surface of said heat radiating plate.

17. A semiconductor package comprising:

a first semiconductor having at least one upper face electrode on an upper face of said first semiconductor, and a lower face electrode on a lower face of said first semiconductor;

a heat radiating plate having a surface to which is joined said lower face electrode via solder or conductive paste; and pillared electrodes joined to said at least one upper face electrode and said heat radiating plate, respectively, with leading ends of said pillared electrodes being exposed so as to constitute electric connecting parts, wherein said leading ends of said pillared electrodes joined to said at least one upper face electrode and said heat radiating plate are equally spaced from said surface of said heat radiating plate relative to one another, and wherein each of said pillared electrodes comprises an inner portion and an outer portion, with said inner portion having a melting temperature that is different than a melting temperature of said outer portion.

18. The semiconductor package according to claim 17, wherein all of said leading ends of said pillared electrodes joined to said at least one upper face electrode and said heat radiating plate are substantially equally spaced relative to one another from said surface of said heat radiating plate.

* * * * *